United States Patent [19]

Gates, II et al.

[11] Patent Number: 5,622,788
[45] Date of Patent: Apr. 22, 1997

[54] METHOD OF SOLDER BONDING, AND ARTICLE PRODUCED BY THE METHOD

[75] Inventors: John V. Gates, II, New Providence; Gerard E. Henein, Chatham; Joseph Shmulovich, Murray Hill, all of N.J.

[73] Assignee: Lucent Technologies Inc., Murray Hill, N.J.

[21] Appl. No.: 555,933

[22] Filed: Nov. 9, 1995

Related U.S. Application Data

[63] Continuation of Ser. No. 355,146, Dec. 13, 1994, abandoned.

[51] Int. Cl.$^6$ ........................................... B32B 15/00
[52] U.S. Cl. ........................... 428/688; 428/409; 428/646; 428/472; 428/673; 228/123.1; 438/65
[58] Field of Search ........................... 428/409, 646, 428/672, 673, 688; 437/183, 179

[56] References Cited

U.S. PATENT DOCUMENTS

| | | | |
|---|---|---|---|
| 4,518,112 | 5/1985 | Miller | 228/124 |
| 4,772,935 | 9/1988 | Lawler | 357/71 |
| 5,061,552 | 10/1991 | Satou | 428/209 |
| 5,162,257 | 11/1992 | Yung | 437/183 |
| 5,307,434 | 4/1994 | Blonder | 385/91 |

*Primary Examiner*—Nasser Ahmad
*Attorney, Agent, or Firm*—John M. Harman; Eugen E. Pacher

[57] ABSTRACT

Thermal expansion mismatch between solder and substrate can result in substrate cracking, especially in the case of brittle substrates, e.g., Si or glass. This problem can be substantially eliminated through use of a novel bonding pad structure that comprises a sacrificial layer and a confinement layer disposed on the former, with a window through the latter. The confinement layer (e.g., Ti or Cr) is selected to be substantially inert with respect to the solder (e.g, AuSn) at the soldering temperature, and the sacrificial layer (e.g., Au) is selected to interact with the solder at that temperature, such that the molten solder consumes at least some of the sacrificial material, with the interface between the molten material moving laterally underneath the confinement layer. After re-solidification of the molten material the structure effectively has a distributed interface between the resolidified material and the substrate, with attendant decrease of stress in the substrate. The novel approach has wide applicability, e.g., for soldering Si chips to a Si chip carrier, or for soldering an optical fiber to a Si/SiO$_2$ substrate.

7 Claims, 1 Drawing Sheet

METHOD OF SOLDER BONDING, AND ARTICLE PRODUCED BY THE METHOD

This application is a continuation of application Ser. No. 08/355,146, filed on Dec. 13, 1994, now abandoned.

FIELD OF THE INVENTION

This invention pertains to solder bonding.

BACKGROUND OF THE INVENTION

In many areas of technology there exists a need for solder bonding a body to another body. See, for instance, U.S. Pat. No. 5,307,434, incorporated herein by reference, which discloses an optical fiber laser transmitter that comprises a body, typically a Si substrate, with both a laser and an optical fiber solder bonded to the substrate.

Although solder bonding is conventional and widely used, there still exist problems. Exemplarily, substrate cracking at or near the solder bonding site has been observed when soldering an optical fiber to a relatively brittle substrate. Such cracking is obviously highly undesirable, and it would be desirable to have available a solder bonding method that reduces or eliminates the cracking problem. The application discloses such a method.

SUMMARY OF THE INVENTION

We have discovered that thermal expansion mismatch between the solder and the substrate can, in prior art structures, result in significant stresses that can lead to bond failure and/or substrate cracking. We have also found a way to effectively distribute the stress, and thereby substantially eliminate the previously observed failures.

Specifically, the invention is embodied in an article that compiles a first body, with a solder pad disposed on a surface of the first body, and a second body that is joined to the first body at the solder pad by means of solder of a given composition. Exemplarily the solder is MSn solder, where M is Au or Ag. It will be understood that the designation "MSn" does not imply the presence of equal mole percents of M and Sn. Significantly, the article further comprises a confinement layer that is disposed on the solder pad, with a window (not necessarily having a continuous edge) through the confinement layer to the solder pad. The confinement layer is substantially inert with respect to molten solder of the given composition at the soldering temperature. The solder pad comprises a first ("sacrificial") layer of a material selected to interact with molten solder of the given composition at the soldering temperature, such that, after cooling of the molten material below the melting point thereof, re-solidified material extends beyond said window underneath said confinement layer.

The above referred to interaction between the molten solder and the sacrificial material typically involves diffusion between the molten solder and the sacrificial layer, with attendant local lowering of the melting point of the sacrificial layer material.

The invention is also embodied in a method of making an article that comprises a first body and a second body that is solder bonded to the first body. The method comprises providing the first body, with a solder pad disposed on a surface of the first body, and with a quantity of solder of a given composition disposed on the solder pad, and further comprises contacting the solder with the second body and heating the solder to a soldering temperature above the melting temperature of the solder. It still further comprises allowing the solder to cool such that re-solidified solder results.

Significantly, the method further comprises providing a confinement layer on the solder pad, said confinement layer having a window therethrough and being substantially inert with respect to said solder at the soldering temperature, and still further comprises providing a solder pad that comprises a first layer of sacrificial material selected to interact with said solder at the soldering temperature such that, after allowing the solder to cool, re-solidified molten material extends beyond said window underneath said confinement layer.

As will be readily understood by those skilled in the art, the novel method is not restricted to soldering optical fiber to a Si substrate, but has wide applicability. For instance, it has utility for solder bonding of Si chips to a Si substrate, as is practiced in "wafer-scale integration".

DETAILED DESCRIPTION

Figure 1:
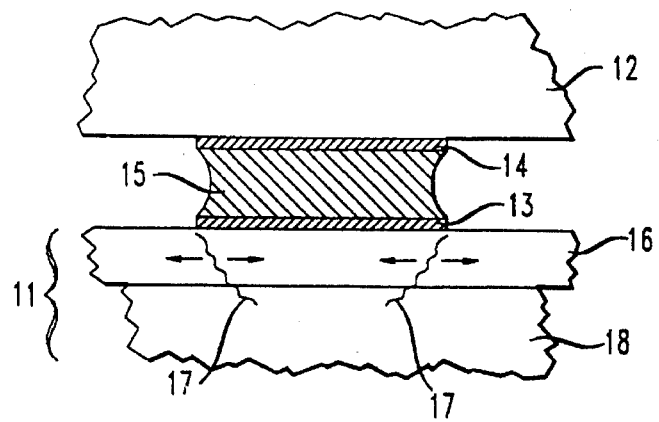
FIG. 1 shows schematically a prior art solder bond.

We have found that in many first body/solder/second body combinations there can exist significant thermal expansion mismatch between, e.g., the solder and the first body (the "substrate"). Such mismatch can result in significant stress, which in turn can result in bond failure or even in cracking of the substrate, especially if the substrate comprises relatively brittle material such as silicon or glass. This problem is typically most significant if the molten solder is confined to a predetermined area of the substrate surface by means of, e.g., a solder pad and/or a solder "dam". As is schematically illustrated by FIG. 1, the molten solder wets the solder pad but does not spread beyond it, assuming a shape that typically has a relatively large contact angle with the substrate. This typically results in stress concentration in the substrate at the air/solder interface, and can cause formation of cracks 17. In FIG. 1, numerals 11–15 refer, respectively, to the first body, the second body, the bonding pad on the first body, the corresponding bonding pad on the second body, and the re-solidified solder. The first body exemplarily is a compound body comprising a Si body 18 and a SiO$_2$ layer 16. Arrows in layer 16 indicate the stresses in the layer, assuming that the thermal expansion coefficient of the solder is greater than that of the substrate material. If the stresses are sufficiently large, cracking of the substrate can occur.

Figure 2:
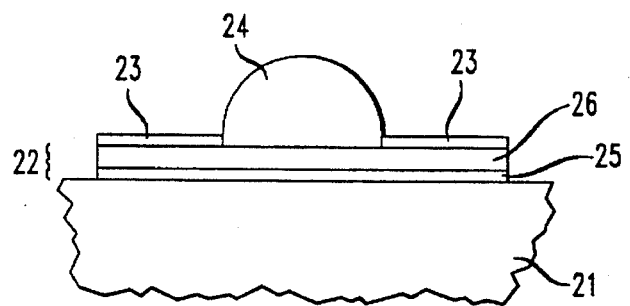
FIG. 2 schematically depicts an exemplary bonding region according to the invention prior to bonding.

FIG. 2 schematically depicts a substrate/solder combination according to the invention prior to solder bonding, wherein numerals 21–24 refer, respectively, to the (optionally compound) substrate, the bonding pad, the confinement layer, and a solder bump disposed in a "window" in the confinement layer. The bonding pad is shown to comprise an optional layer 25 and a layer 26 of "sacrificial" material. The optional layer may be a multilayer structure comprising, for instance, an "adhesion" (e.g., Ti) layer that facilitates bonding between the substrate and the solder, and a "barrier" layer (e.g., Pt) that prevents interaction between the adhesion layer and the overlying material, e.g., Au. Such structures are known to those skilled in the art. It is also known to provide a titanium nitride layer between the Ti layer and the Pt layer.

Figure 3:
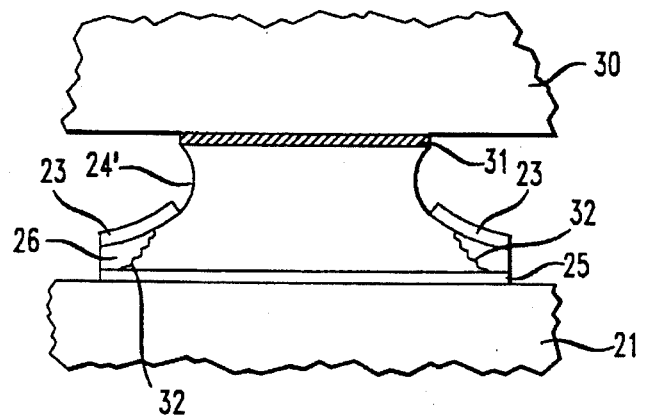
FIG. 3 schematically shows a completed solder bond according to the invention.

The sacrificial material is selected to interact with the solder material at the solder temperature, such that molten material can progressively extend beyond the window in the confinement layer. The lateral progress of molten material underneath the confinement layer typically results in some uplift of the confinement layer, with the "foot" of the solder bump assuming wedge shape. This is schematically depicted in FIG. 3, which shows second body 30 solder bonded to the first body 21, and re-solidified material 24' extending beneath the confinement layer 23. Material 26 is the remaining (unmelted) portion of sacrificial layer 26 of FIG. 2, and numeral 32 refers to the interface between the original sacrificial material and the re-solidified material. Retention of unmelted sacrificial material is optional.

We currently believe that molten solder material (e.g., eutectic AuSn, containing about 80 weight % Au) interacts with the material of the sacrificial layer (e.g., Au) to locally form a molten alloy of composition that differs from the original solder composition. The molten solder material consumes (dissolves) sacrificial material in the window, and begins to advance laterally underneath the confinement layer, in the process becoming enriched in the sacrificial material. As the molten mixture at the solid/liquid interface underneath the confinement layer becomes more and more enriched in sacrificial layer material, the advance of the interface slows down and eventually stops. In many cases the molten material not only interacts with the sacrificial layer material but also interacts with the layer below the sacrificial layer. For instance, we currently believe that Sn interacts with the Pt of the barrier layer, and that this interaction may contribute to the efficacy of the inventive technique.

The above description of the mechanics of the novel method is provided for tutorial purposes only, and the invention does not depend on the correctness of the proposed mechanism.

As those skilled in the art will appreciate, the geometry of a solder bond according to the invention is such that the transition between bond and non-bond region effectively is distributed, with attendant spreading of the stresses over a much larger volume of the substrate. Consequently, the incidence of substrate cracking can be much reduced. For instance, in a particular experimental run, optical fibers were soldered to 35 prior art structures (i.e., comprising bonding pads without confinement layer and sacrificial layer). Inspection of the resulting product revealed that 33 of the 35 substrates were cracked. In a further experimental run, that differed from the above referred to run only with regard to the bonding pads, optical fibers were soldered to 15 structures according to the invention, i.e., comprising a 0.5 µm thick Au (sacrificial) layer and a 0.1 µm thick (Cr) confinement layer. Inspection revealed that none of the resulting structures were cracked. Temperature cycling (40 times −40° C. to +85° C.) of 10 further structures according to the invention resulted in no cracking. Clearly, these experimental results demonstrate that the instant invention can effectively eliminate the above described cracking problem.

EXAMPLE

An optical fiber was solder bonded to a substrate substantially as described in U.S. Pat. No. 5,307,434. Specifically, a $SiO_2$ film (0.4–20 µm) was formed on a Si body and was patterned, all by conventional methods. A thin film resistor layer was deposited and patterned into a thin film heater. An intermediate dielectric layer (e.g., about 100 nm $SiO_2$ or SiN) was deposited by PECVD and patterned such that the dielectric was left under the fiber bonding site but removed elsewhere. The solder pad was formed as follows: an adhesion layer (e.g., 100 nm Ti, or 50 nm Ti and 25 nm TiN) was deposited, followed by a barrier layer (e.g., 0.2 µm Pt), followed in turn by a sacrificial material layer (e.g., 0.5 µm Au). Deposition can be by any convenient method, e.g., sputtering or e-beam evaporation. The deposited layers were patterned to form the desired solder pad. This was followed by deposition of the confinement layer (e.g., 0.1 µm Ti or Cr) by conventional means, followed by conventional patterning of the confinement layer such that confinement layer material is disposed on the sacrificial material of the solder pad, with an elongate window extending through the confinement layer. Finally, a thin film solder (e.g., 6 µm eutectic AuSn) was e-beam evaporated through the window onto the sacrificial material, using a conventional lift-off technique. After placement of a suitably metallized fiber onto the solder in the window, the heater was energized such that the solder melted. The solder temperature was about 320° C., and was maintained for about 30 seconds. After switching off the heater current the solder re-solidified, bonding the fiber to the Si body. Optical microscopy revealed that the confinement layer was no longer planar and parallel to the underlying Si surface, but instead was partially raised, substantially as shown in FIG. 3, indicative of the fact that the solid/liquid interface had moved laterally underneath the confinement layer. Compositional analysis shows that the resolidified material underneath the confinement layer is more Au-rich than the eutectic composition.

Although most of the above discussion was in terms of AuSn solder and Au sacrificial layer, the invention is not so limited. Indeed, the invention can be practiced with any multicomponent solder (e.g., eutectic AgSn, or PbSn), provided that an appropriate sacrificial material exists. Such a material is selected to have a higher melting temperature than the solder, and to readily interact with the solder at the soldering temperature, with a relatively small local addition of sacrificial material to the molten solder resulting in a relatively large change in the local freezing temperature of the molten material. Exemplarily, if the solder is eutectic AgSn or PbSn then an appropriate exemplary sacrificial material is Au. It should be noted that sacrificial materials for use with a given solder are not limited to elements that are a component of the solder.

We claim:

1. An article comprising
   a) a first body, with a bonding pad disposed on a surface of the first body; and
   b) a second body that is joined to the first body at the bonding pad by means of solder of a given composition;

CHARACTERIZED IN THAT the article further comprises
   c) a confinement layer, having a window therethrough for receiving a portion of the solder of the given composition and disposed on said bonding pad, said confinement layer being substantially inert with respect to molten solder of the given composition at a soldering temperature; wherein
   d) the bonding pad comprises a first layer of a sacrificial material selected to interact at the soldering temperature with molten solder of the given composition such that, after cooling of the solder below the melting point thereof, re-solidified molten material comprising a portion of the solder and a portion of the sacrificial material extends laterally and vertically beyond said window whereby at least a portion thereof forms a wedge shape to distribute stress over an area of said first body larger than the area of said bonding pad disposed on said first body prior to interaction between said solder and said sacrificial material.

2. An article according to claim 1, wherein the solder is MSn solder and said sacrificial material is M, where M is selected from the group consisting of Ag and Au.

3. An article according to claim 2, wherein the confinement layer is a layer of material selected from the group consisting of Ti and Cr.

4. An article according to claim 3, wherein the first body comprises a layer of $SiO_2$, and the bonding pad comprises, in sequence, i) a Ti layer, a Pt layer, and a Au sacrificial layer; or comprises ii) a Ti layer, a titanium nitride layer, a Pt layer, and a Au sacrificial layer.

5. An article according to claim 1, further comprising a resistor adapted for heating said solder to the soldering temperature.

6. An article according to claim 1, wherein the second body is an optical fiber.

7. Method of making an article comprising a first body and a second body that is solder bonded to the first body, the method comprising a) providing a first body, with a bonding pad disposed on a surface of the first body, and with a quantity of solder of a given composition disposed on a portion of the bonding pad;

b) contacting said quantity of solder with the second body, heating the solder to a soldering temperature above the melting temperature of the solder, and allowing the solder to cool such that re-solidified solder results;

CHARACTERIZED IN THAT the method further comprises c) providing a confinement layer on the bonding pad, said confinement layer having a window therethrough for receiving a portion of said solder and being substantially inert with respect to said solder at the soldering temperature; and d) the bonding pad comprises a first layer of sacrificial material selected to interact with said solder at the soldering temperature such that, after allowing the solder to cool, re-solidified molten material comprising a portion of the solder and a portion of the sacrificial material extends laterally and vertically beyond said window whereby at least a portion thereof forms a wedge shape to distribute stress over an area of said first body larger than the area of said bonding pad disposed on said first body prior to interaction between said solder and said sacrificial material.

* * * * *